United States Patent
Choi (10) Patent No.: US 8,027,205 B2
(45) Date of Patent: Sep. 27, 2011

(54) SEMICONDUCTOR MEMORY DEVICE AND OPERATION METHOD THEREOF

(75) Inventor: Byeong-Chan Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 170 days.

(21) Appl. No.: 12/489,534

(22) Filed: Jun. 23, 2009

(65) Prior Publication Data

US 2010/0165759 A1 Jul. 1, 2010

(30) Foreign Application Priority Data

Dec. 31, 2008 (KR) ........................ 10-2008-0138485

(51) Int. Cl.
*G11C 7/00* (2006.01)
*G11C 8/00* (2006.01)

(52) U.S. Cl. .............. 365/189.05; 365/189.17; 365/193; 365/194; 365/230.08; 365/233.1; 365/233.18

(58) Field of Classification Search ............. 365/189.05, 365/189.17, 193, 194, 230.08, 233.1, 233.18
See application file for complete search history.

(56) References Cited

U.S. PATENT DOCUMENTS

| | | | | |
|---|---|---|---|---|
| 6,272,070 B1 * | 8/2001 | Keeth et al. ................. 365/194 |
| 6,337,809 B1 | 1/2002 | Kim et al. |
| 6,445,643 B2 * | 9/2002 | Keeth et al. ................. 365/194 |
| 6,563,759 B2 * | 5/2003 | Yahata et al. .............. 365/233.1 |
| 6,680,866 B2 * | 1/2004 | Kajimoto .................... 365/193 |
| 6,950,370 B2 * | 9/2005 | Lee ........................... 365/233.13 |
| 6,980,479 B2 * | 12/2005 | Park ............................. 365/193 |
| 6,987,704 B2 * | 1/2006 | Park ............................. 365/193 |
| 7,054,222 B2 * | 5/2006 | Li et al. ....................... 365/194 |
| 7,113,446 B2 * | 9/2006 | Fujisawa ................. 365/189.05 |
| 7,304,898 B2 * | 12/2007 | Lee et al. ..................... 365/193 |
| 7,450,442 B2 * | 11/2008 | Kang ........................... 365/193 |
| 7,529,140 B2 | 5/2009 | Kim et al. |
| 7,869,286 B2 * | 1/2011 | Park et al. .................. 365/193 |
| 7,881,149 B2 * | 2/2011 | Johnson et al. ........... 365/233.1 |
| 2003/0026138 A1 | 2/2003 | Lee et al. |
| 2007/0070730 A1 | 3/2007 | Kim et al. |
| 2009/0052271 A1 | 2/2009 | Kim et al. |

FOREIGN PATENT DOCUMENTS

| | | |
|---|---|---|
| JP | 2007-095261 | 4/2007 |
| KR | 1020060115336 | 11/2006 |
| KR | 1020090126607 | 12/2009 |

OTHER PUBLICATIONS

Notice of Allowance issued from Korean Intellectual Property Office on Dec. 31, 2010.

* cited by examiner

*Primary Examiner* — Trong Phan
(74) *Attorney, Agent, or Firm* — IP & T Group LLP (57) ABSTRACT

A semiconductor memory device includes a strobe signal generator for receiving a write command and generating a write strobe signal that defines an activation period variably according to an operation frequency, and a data transfer unit for transferring data from an external device to an internal data line in response to the write strobe signal.

19 Claims, 6 Drawing Sheets

SEMICONDUCTOR MEMORY DEVICE AND OPERATION METHOD THEREOF

CROSS-REFERENCE TO RELATED APPLICATIONS

The present invention claims priority of Korean patent application number 10-2008-0138485, filed on Dec. 31, 2008, respectively, the disclosure of which is incorporated herein by reference in its entirety.

BACKGROUND OF THE INVENTION

The present invention relates to a semiconductor design technology, and more particularly, to a semiconductor memory device for generating a write strobe signal activated in a write operation and transferring data from an external device to an internal data line using the generated write strobe signal.

In general, a semiconductor memory device such as Double Data Rate Synchronous DRAM (DDR SDRAM) includes more than ten million memory cells for storing data. Such a semiconductor memory device stores data or outputs the data according to a command requested by the central processing unit (CPU). That is, when the CPU requests a write operation, the semiconductor memory device stores data in a memory cell corresponding to an address inputted from the CPU. When the CPU requests a read operation, the semiconductor memory device reads data stored in a memory cell corresponding to an address inputted from the CPU. In other word, data inputted through an input/output pad is inputted to a memory cell through a data input path in a write operation. In a read operation, data stored in a memory cell is read through a data output path and outputted through the input/output pad.

Figure 1:
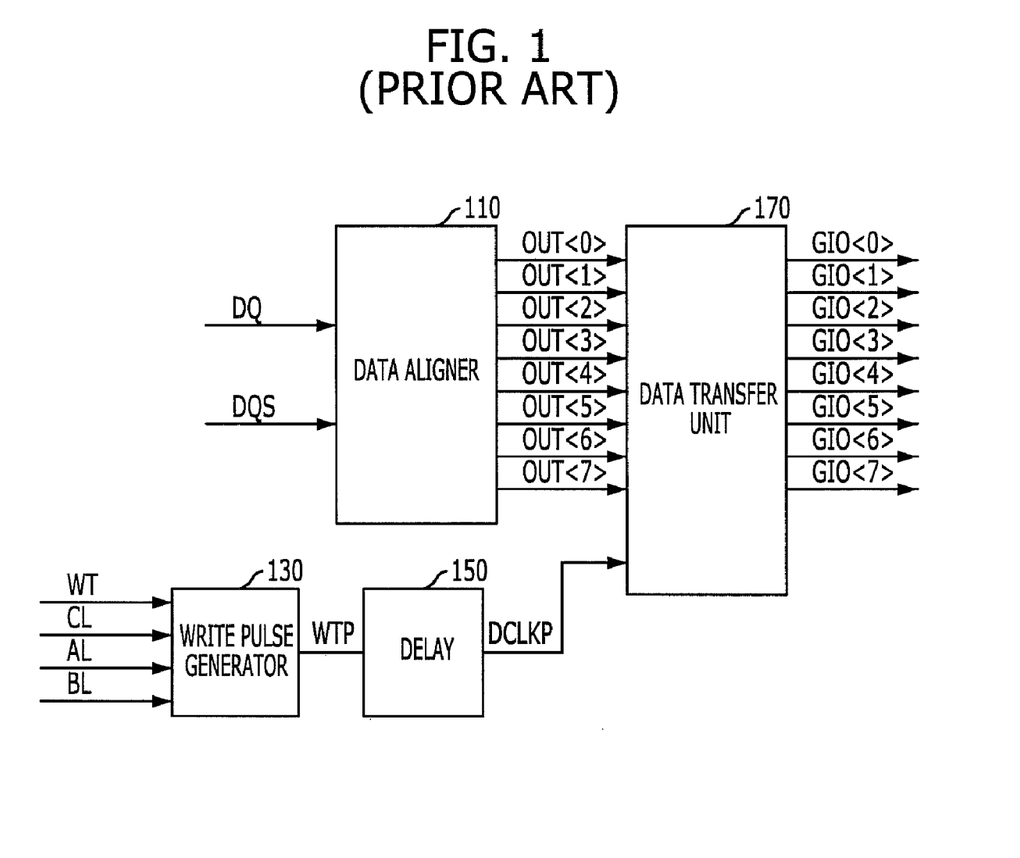
FIG. 1 is a block diagram illustrating a partial structure of a semiconductor memory device according to prior art.

FIG. 1 is a block diagram illustrating a partial structure of a semiconductor memory device according to prior art.

Referring to FIG. 1, the semiconductor memory device according to prior art includes a data aligner 110, a write pulse generator 130, a delay 150, and a data transfer unit 170.

The data aligner 110 aligns serial input data R0, F0, R1, F1, R2, F2, R3, and F3 (see FIG. 2) that are sequentially inputted through the input/output pad DQ in response to a data strobe signal DQS and outputs the aligned serial input data as $0^{th}$ to $7^{th}$ parallel output data OUT<0:7>. That is, the data aligner 110 latches the serial input data R0, F0, R1, F1, R2, F2, R3, and F3 by synchronizing the serial input data R0, F0, R1, F1, R2, F2, R3, and F3 with a falling edge and a rising edge of a data strobe signal DQS. The latched serial input data R0, F0, R1, F1, R2, F2, R3, and F3 become the $0^{th}$ to $7^{th}$ parallel output data OUT<0:7>. Here, the burst length BL is 8 because the number of the serial input data R0, F0, R1, F1, R2, F2, R3, and F3 is eight.

The write pulse generator 130 generates a write pulse signal WTP in response to a write command WT, a CAS latency CL, an additive latency AL, and a burst length BL. The write pulse signal WTP has a predetermined pulse width.

The delay unit 150 generates a write strobe signal DCLKP by reflecting an asynchronous delay time to the write pulse signal. Here, the generated write strobe signal DCLKP is delayed until the data aligner 110 completely aligns the serial input data R0, F0, R1, F1, R2, F2, R3, and F3. That is, the write strobe signal DCLKP is activated at a time of completely aligning all of the serial input data R0, F0, R1, F1, R2, F2, R3, and F3. Here, the write strobe signal DCLKP has a pulse width identical to the write pulse signal WTP.

The data transfer unit 170 transfers $0^{th}$ to $7^{th}$ output data OUT<0:7> of the data aligner 110 to $0^{th}$ to $7^{th}$ global input/output lines GIO<0:7> in response to the write strobe signal DCLKP.

Figure 2:
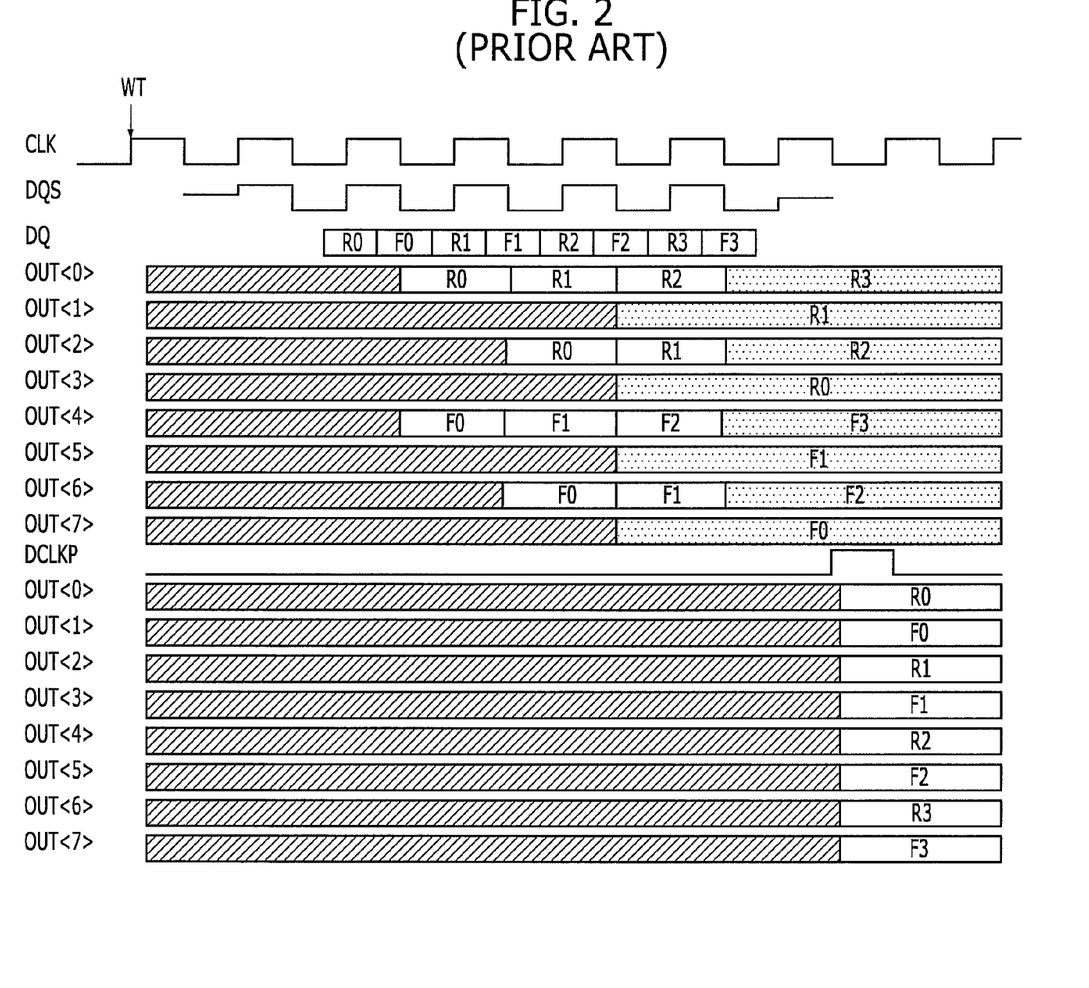
FIG. 2 is a diagram illustrating signals related to a semiconductor memory device shown in FIG. 1.

FIG. 2 is a diagram for describing signals related to a semiconductor memory device of FIG. 1.

Referring to FIGS. 1 and 2, when a write command WT is applied after being synchronized with an external clock signal CLK, a data strobe signal DQS and serial input data R0, F0, R1, F1, R2, F2, R3, and F3 are inputted corresponding to CAS latency CL and additive latency AL. The data aligner 110 latches the serial input data R0, F0, R1, F1, R2, F2, R3, and F3 in response to the data strobe signal DQS. The latched serial input data R0, F0, R1, F1, R2, F2, R3, and F3 becomes the $0^{th}$ to $7^{th}$ parallel output data OUT<0:7>.

The write strobe signal DCLKP is activated when the data aligner 110 completely aligns the serial input data R0, F0, R1, F1, R2, F2, R3, and F3. By delaying such a write strobe signal DCLKP using the delay 150 (see FIG. 1), it is possible to activate the write strobe signal DCLKP when the serial input data R0, F0, R1, F1, R2, F2, R3, and F3 are completely aligned because the write pulse signal WTP (not shown in FIG. 2) is activated at least input data F3 corresponding to CAS latency CL, additive latency AL and burst latency BL. Each of the $0^{th}$ to $7^{th}$ parallel output data OUT<0:7> is transferred to corresponding $0^{th}$ to $7^{th}$ global input/output lines GIO<0:7> in response to the write strobe signal DCLKP.

Hereinafter, the write strobe signal DCLKP will be described in more detail. The write strobe signal DCLKP is activated when the serial input data R0, F0, R1, F1, R2, F2, R3, and F3 are completely aligned. Also, the write strobe signal DCLKP is inactivated after passing a time that allows the $0^{th}$ to $7^{th}$ output data OUT<0:7> to be transferred to corresponding global input/output lines GIO<0:7>. That is, a time of activating and a time of inactivating the write strobe signal DCLKP are defined by the write pulse signal WTP and the delay 150 that delays the write pulse signal.

Meanwhile, semiconductor memory devices have been advanced to perform operation in a high speed. Accordingly, an operation frequency of semiconductor memory devices has increased and semiconductor memory devices are being designed to perform consecutive write operations. However, such an operation of the semiconductor memory devices also causes other problem.

Figure 3A:
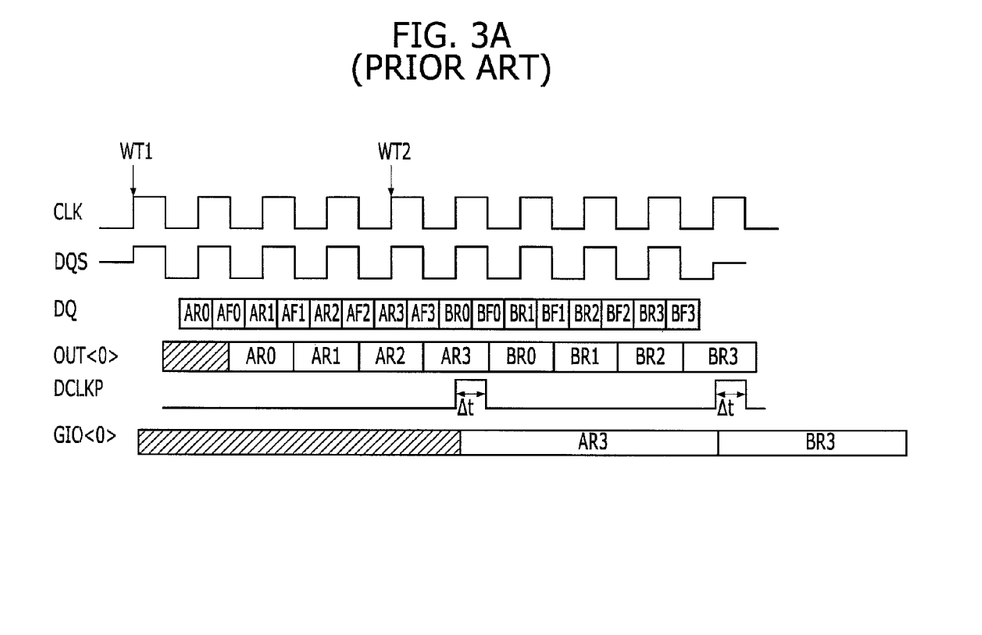
FIGS. 3A and 3B are diagrams describing a normal operation and an abnormal operation of a semiconductor memory device according to prior art.
Figure 3B:
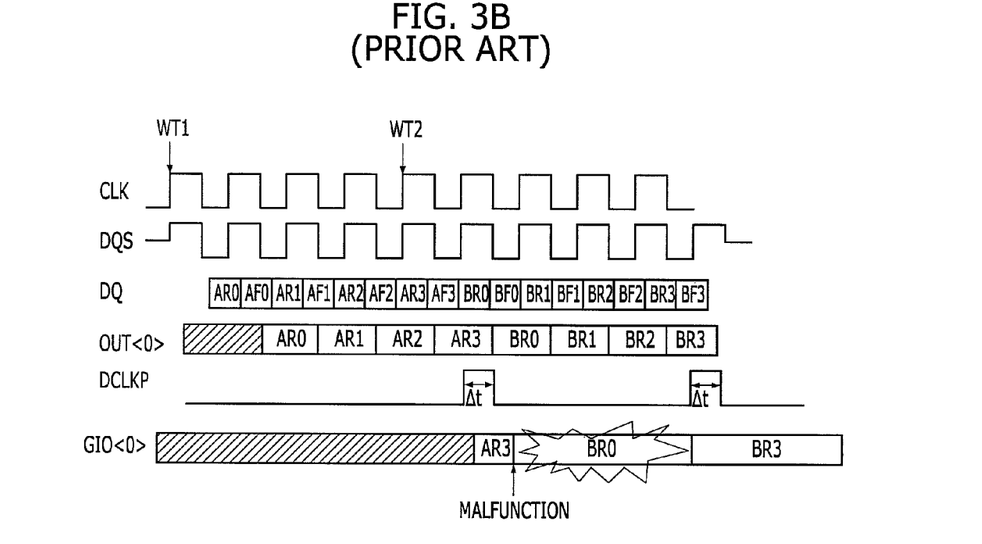

FIGS. 3A and 3B are diagrams describing a normal operation and abnormal operation of a semiconductor memory device according to prior art. That is, FIGS. 3A and 3B show an operation of a semiconductor memory device when a write command is continuously inputted thereto. For the sake of easier description, a write command inputted first is referred as a first write command WT1, and a write command inputted second is referred as a second write command WT2.

At first, the normal operation of the semiconductor memory device will be described with reference to FIGS. 1 and 3A. FIG. 3A shows an operation of a semiconductor memory device having a comparatively low operation frequency.

When the first write command WT1 is applied, the data strobe signal DQS is activated, and the serial input data AR0, AF0, AR1, AF1, AR2, AF2, AR3, and AF3 corresponding to the first write command WT1 are sequentially inputted. Then, the serial input data AR0, AF0, AR1, AF1, AR2, AF2, AR3, and AF3 are aligned by the data aligner 110 and become $0^{th}$ to $7^{th}$ output data OUT<0:7>. For the sake of easier description, FIG. 3A shows the $0^{th}$ output data OUT<0> and a corresponding $0^{th}$ global input/output line GIO<0>. That is, the $0^{th}$ output data OUT<0> outputs AR0, AR1, AR2, and AR3 corresponding to the first write command WT1.

The write strobe signal DCLKP generated by the delay 150 is activated at the center of the last input data AR3 corresponding to the write command WT1 and inactivated after passing a predetermined time Δt. Here, the predetermined time Δt corresponds to a pulse width of a write pulse signal WTP generated by the write pulse generator 130. Since a pulse width is included in the last input data AR3 corresponding to the first write command WT1 in case of a semiconductor memory device having a comparative low operation frequency, the last input data AR3 is safely received through the $0^{th}$ global input/output line GIO<0>.

When the second write command WT2 is applied, serial input data BR0, BF0, BR1, BF1, BR2, BF2, BR3, and BF3 corresponding the second write command WT2 are sequentially applied after the last input data AR3 corresponding to the first write command WT1. Similarly, the serial input data BR0, BF0, BR1, BF1, BR2, BF2, BR3, and BF3 are aligned in the data aligner 110 and become $0^{th}$ to $7^{th}$ output data OUT<0:7>. Then, the write strobe signal DCLKP is activated at the center of the last input data BR3 corresponding to the second write command WT2 and is inactivated after passing a predetermined time Δt. Therefore, the last input data BR3 corresponding to the second write command WT2 is safely received through the $0^{th}$ global input/output line GIO<0>.

Hereinafter, an abnormal operation of a semiconductor memory device will be described with reference to FIGS. 1 and 3B. FIG. 3B shows operation of a semiconductor memory device having a comparatively high operation frequency.

When a first write command WT1 is applied, a data strobe signal DQS is activated and serial input data AR0, AF0, AR1, AF1, AR2, AF2, AR3, and AF3 corresponding to the first write command WT1 are sequentially inputted. Then, the serial input data AR0, AF0, AR1, AF1, AR2, AF2, AR3, and AF3 are aligned by the data aligner 110 and become $0^{th}$ to $7^{th}$ output data OUT<0:7>. FIG. 3B exemplarily shows only $0^{th}$ output data OUT<0> among the $0^{th}$ to $7^{th}$ output data OUT<0:7> and a $0^{th}$ global input/output line GIO<0>.

Then, a write strobe signal DCLKP generated from the delay 150 is activated at the center of the last input data AR3 corresponding to the first write command WT1 and is inactivated after passing a predetermined time Δt. In case of a semiconductor memory device having a comparatively high operation frequency, frequencies of an applied external clock signal CLK and a data strobe signal DQS are also high and the data aligner 110 operates according to the high frequency thereof. Therefore, a valid data period of each of the $0^{th}$ to $7^{th}$ output data OUT<0:7> becomes shortened. The shortened valid data period means that the write strobe signal DCLKP activated for a predetermined time Δt may influence input data after the predetermined time Δt.

That is, the write strobe signal DCLKP activated at the center of the last input data AR3 corresponding to the first write command WT1 is inactivated after passing a predetermined time Δt. However, the first input data BR0 corresponding to the second write command WT2 is outputted as the $0^{th}$ output data OUT<0> before the write strobe signal DCLKP is inactivated as the operation frequency increases. Therefore, the first input data BR0 corresponding to the second write command WT2 is transferred to the $0^{th}$ global input/output line GIO<0>. That is, the semiconductor memory device performs an abnormal operation.

As described above, the semiconductor memory device according to the prior art may not transfer data to a corresponding global input/output line because the last input data AR3 corresponding to the first write command WT1 and the first input data BR0 corresponding to the second write command WT2 are included in the activation period of the same write strobe signal DCLKP. Therefore, the reliability of the semiconductor memory device according to prior art is deteriorated in the write operation.

SUMMARY OF THE INVENTION

Embodiments of the present invention are directed to providing a semiconductor memory device for controlling an active period of a write strobe signal according to an operation frequency in a write operation.

In accordance with an aspect of the present invention, there is provided a semiconductor memory device including a strobe signal generator configured to receive a write command and generating a write strobe signal that defines an activation period variably according to an operation frequency, and a data transfer unit configured to transfer data from an external device to an internal data line in response to the write strobe signal.

The semiconductor memory device may further include a pulse delay unit configured to delay a write pulse signal until a predetermined time point where the write pulse signal is generated in response to the write command.

In accordance with another aspect of the present invention, there is provided a method of driving a semiconductor memory device, including activating a write strobe signal in response to a write command, sustaining activation of the write strobe signal during a period corresponding to an operation frequency, and to transfer data from an external device to an internal data line in response to the write strobe signal.

Therefore, it is possible to secure a stable time for applying data to a global input/output line by controlling an active period of a write strobe signal based on an operation frequency when a semiconductor memory device performs a write operation.

DESCRIPTION OF SPECIFIC EMBODIMENTS

Other objects and advantages of the present invention can be understood by the following description, and become apparent with reference to the embodiments of the present invention.

Figure 4:
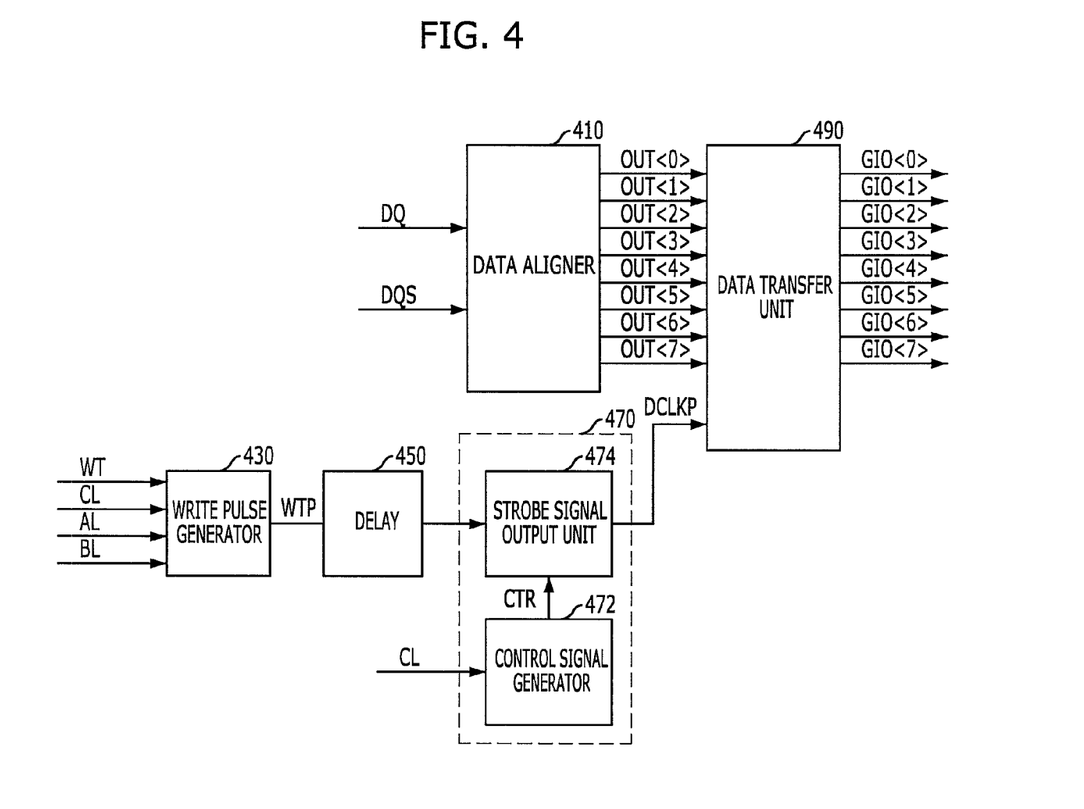
FIG. 4 is a block diagram illustrating a partial structure of a semiconductor memory device in accordance with an embodiment of the present invention.

FIG. 4 is a block diagram illustrating a partial structure of a semiconductor memory device in accordance with an embodiment of the present invention.

Referring to FIG. 4, the semiconductor memory device according to the present embodiment includes a data aligner 410, a write pulse generator 430, a delay 450, a strobe signal generator 470, and a data transfer unit 490.

The data aligner 410 aligns serial input data R0, F0, R1, F1, R2, F2, R3, and F3, sequentially inputted through an input/output pad DQ in response to a data strobe signal DQS and outputs $0^{th}$ to $7^{th}$ parallel output data OUT<0:7>. The data aligner 410 may be formed of a plurality of latches. Each of the latches may latch the serial input data R0, F0, R1, F1, R2, F2, R3, and F3 in response to a rising edge and a falling edge of a data strobe signal DQS. The latched serial input data R0, F0, R1, F1, R2, F2, R3, and F3 may become the $0^{th}$ to $7^{th}$ parallel output data OUT<0:7>.

Here, the eight serial input data R0, F0, R1, F1, R2, F2, R3, and F3 mean that a burst length BL is 8. The data strobe signal DQS is for solving an error caused by difference of a data transmit rate among a plurality of transmission lines connecting a central processing unit (CPU) and a semiconductor memory device. In a write operation, the CPU may transmit a data strobe signal DQS with the serial input data R0, F0, R1, F1, R2, F2, R3, and F3.

The write pulse generator 430 may generate a write pulse signal WTP in response to a write command WT, a CAS latency CL, an additive latency AL, and a burst length. The write pulse signal WTP has a predetermined pulse width. For reference, a semiconductor memory device can detect the last input data in serial input data that are sequentially inputted through the input/output pad DQ using the CAS latency CL, the additive latency AL, and the burst length BL. Also, the semiconductor memory device can use a write latency to detect the location of the last input data. Such a write latency may be defined as the CAS latency CL and the additive latency AL. Finally, a time of activating the write pulse signal WTP may correspond to the last input data.

The delay 450 may output the write pulse signal WTP with an asynchronous delay time reflected. That is, the delay 450 may delay outputting a signal until all of latches in the data aligner 410 completely align the serial input data R0, F0, R1, F1, R2, F2, R3, and F3. Therefore, the write strobe signal DCLKP, generated based on the output signal of the delay 450, may be activated when the serial input data R0, F0, R1, F1, R2, F2, R3, and F3 are completely aligned. The output signal of the delay 450 has a pulse width identical to the write pulse signal WTP.

The write pulse generator 430 and the delay 450 may be identified as a pulse delay circuit that delays outputting the write pulse signal WTP generated in response to the write command WT until a predetermined time, for example, until the data aligner 410 completely aligns all of the serial input data R0, F0, R1, F1, R2, F2, R3, and F3.

The strobe signal generator 470 receives the write command WT and generates a write strobe signal DCLKP for defining an active period according to an operation frequency. The strobe signal generator 470 may include a control signal generator 472 and a strobe signal output unit 474. Here, the active period of the write strobe signal DCLKP may be changeable according to an operation frequency in the present embodiment.

The control signal generator 472 may generate a control signal CTR for controlling the active period of the write strobe signal DCLKP in response to a CAS latency CL corresponding to an operation frequency of a semiconductor memory device. The strobe signal output unit 474 receives an output signal of the delay 450 and outputs the write strobe signal DCLKP in response to a control signal CTR.

The data transfer unit 490 may transfer the $0^{th}$ to $7^{th}$ parallel output data OUT<0:7> of the data aligner 410 to $0^{th}$ to $7^{th}$ global input/output lines GIO<0:7> in response to the write strobe signal DCLKP.

Figure 5:
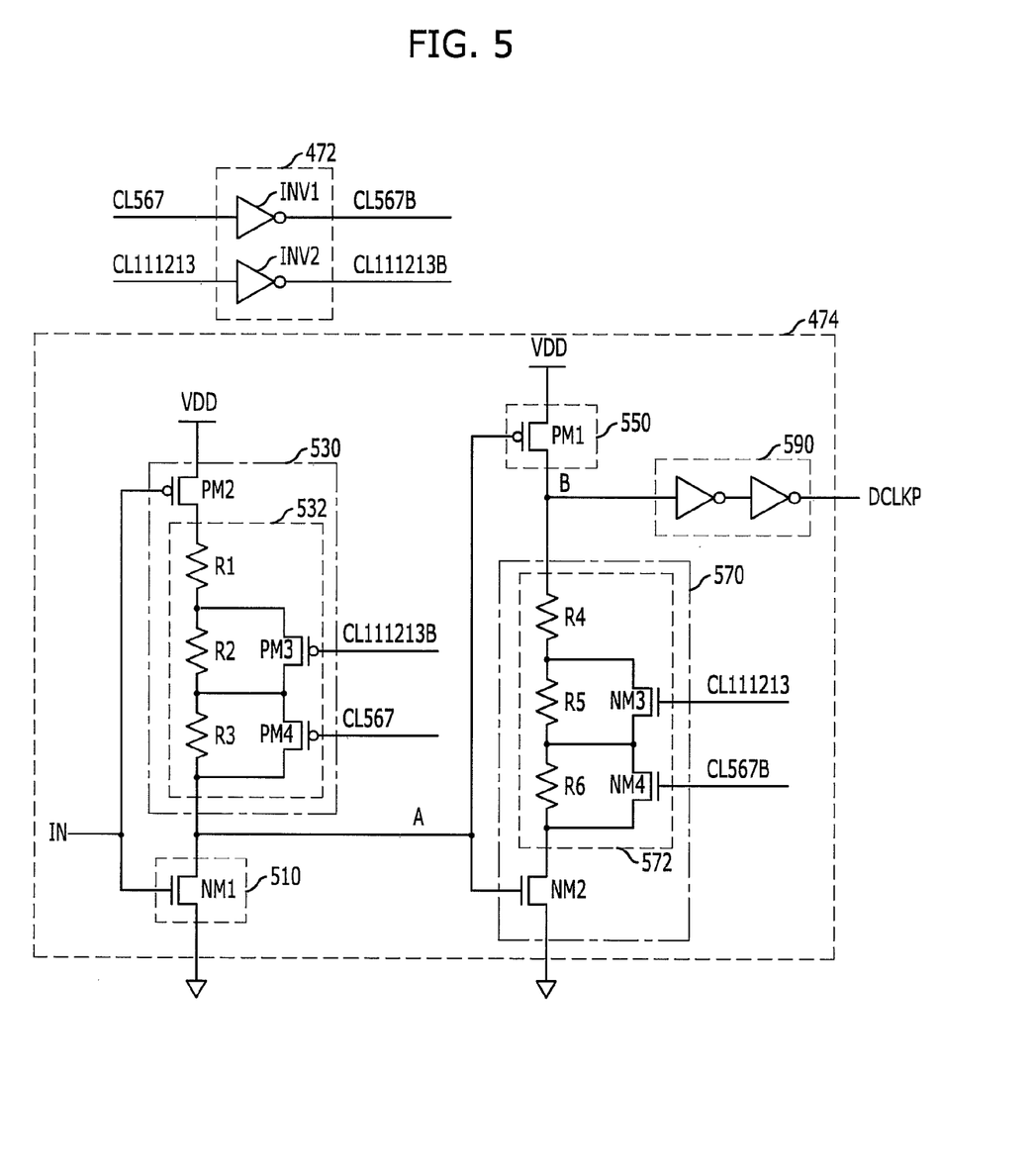
FIG. 5 is a circuit diagram illustrating a control signal generator 472 and a strobe signal output unit 474 of FIG. 4.

FIG. 5 is a circuit diagram describing a control signal generator 472 and a strobe signal output unit 474 of FIG. 4. FIG. 5 exemplarily shows the control signal generator 472 that generates first main/complementary control signal CL567 and CL567B and second main/complementary control signal CL111213 and CL111213B according to a CAS latency CL corresponding to an operation frequency. That is, if an operation frequency of a semiconductor memory device is low, the first main control signal CL567 is activated to logical 'high'. If the operation frequency of the semiconductor memory device is high, the second main control signal CL111213 is activated to logical 'high'.

Referring to FIG. 5, the control signal generator 472 includes a first inverter INV1 and a second inverter INV2. The first inverter INV1 outputs the first complementary control signal CL567B by inverting the first main control signal CL567. The second inverter INV2 outputs a second complementary control signal CL111213B by inverting the second main CL111213.

The strobe signal output unit 474 receives the output signal of the delay 450 (see FIG. 4) through an input end IN and controls a load value of a driving path in response to the first and second main/complementary control signals CL567, CL567B, CL111213, and CL111213B. The strobe signal output unit 474 includes first to fourth drivers 510, 530, 550, and 570, and an output unit 590.

The first and third drivers 510 and 550 drive nodes A and B corresponding to an activation edge of the output signal of the delay, which is applied to the input end IN. The first and third drivers 510 and 550 includes a first NMOS transistor NM1 having a source-drain path between the node A and a ground voltage end VSS and a gate connected to the input end IN and a first PMOS transistor PM1 having a source-drain path between a supply voltage end VDD and the node B and a gate connected to the node A.

For the sake of easier description, a signal applied to the input end IN will be described again in later.

Referring to FIG. 4, the strobe signal output unit 474 receives the output signal of the delay 450. The delay 450 receives a write pulse signal WTP and outputs a delayed signal. That is, the write pulse signal WTP is a pulse signal having a logical high activation period, and the delay 450 outputs the delayed write pulse signal. Therefore, the input end IN receives a pulse signal that has a logical high activation period in response to the write command WT in the write operation.

Referring back to FIG. 5, the first and third drivers 510 and 550 are driven corresponding to a rising edge which is an activation edge of the output signal of the delay 450. That is, the first NMOS transistor NM1 of the first driver 510 is turned on in response to a rising edge of the output signal of the delay 450 and lowers a voltage level of the node A. Then, the first PMOS transistor PM1 of the third driver 550 is turned on in response to the lowered voltage level of the node A and lowers a voltage level of the node B. Finally, the output unit 590 outputs the logic high write strobe signal DCLKP. The strobe signal output unit 474 outputs a logic 'high' signal corresponding to a logic 'high' input signal and a logic 'low' signal corresponding to a logic 'low' input signal. Here, the first and second main/complementary control signals CL567, CL567B, CL111213, and CL111213B can control a time of outputting logic 'low' corresponding to a logic 'low' input signal, that is, a time of inactivating the write strobe signal DCLKP.

Meanwhile, the second and fourth drivers 530 and 570 may drive corresponding nodes A and B in response to an inactivation edge of an output signal of the delay 450, which is applied to the input end IN.

The second driver 530 may include a second PMOS transistor PM2 having a source-drain path between a supply voltage end VDD and a first load controller 532 and a gate connected to the input end IN. Here, the first load controller 532 controls a load value of a driving path of the second driver 530 in response to the first main control signal CL567 and the second complementary control signal CL111213B. The first load controller 532 includes first to third resistors R1, R2, and R3, and third and fourth PMOS transistors PM3 and PM4 respectively connected to the second and third resistor R2 and R3 in parallel. The third PMOS transistor PM3 operates by receiving the second complementary control signal CL111213B through a gate thereof. The fourth PMOS transistor PM4 operates by receiving the first main control signal CL567 through a gate.

The fourth driver 570 may include a second NMOS transistor NM2 having a source-drain path between a second load controller 572 and a ground voltage end VSS and a gate connected to the node A. The second load controller 572 controls a load value of a driving path of the fourth driver 570 in response to the first complementary control signal CL567B and the second main control signal CL111213. The second load controller 572 includes fourth to sixth resistors R4, R5, and R6, and third and fourth NMOS transistors NM3 and NM4 respectively connected to the fifth and sixth resistors R5 and R6 in parallel. The third NMOS transistor NM3 operates by receiving the second main control signal CL111213 through a gate. The fourth NMOS transistor NM4 operates by receiving the first complementary control signal CL567B through a gate.

Hereinafter, operation of the second and fourth driver will be described.

The second and fourth drivers 530 and 570 are driven in response to a falling edge which is an inactivation edge of an output signal of the delay 450. That is, the second PMS transistor PM2 of the second driver 530 is turned on in response to the falling edge of the output signal of the delay 450 and increase a voltage level of the node A after delaying by an amount corresponding to a load value determined based on the first main control signal CL567 and the second complementary control signal CL111213B. Finally, the output unit 590 delaying outputting a logic 'low' write strobe signal DCLKP by a time corresponding to the first and second main/complementary control signals CL567, CL567B, CL111213, and CL111213B.

The pulse width of the write strobe signal DCLKP can be controlled using CAS latency CL which is operation frequency information in the present embodiment. Particularly, a time of activating the write strobe signal DCLKP corresponds to the write command WT and a time of inactivating the write strobe signal DCLKP may correspond to the first and second main/complementary control signals CL567, CL567B, CL111213, and CL111213B.

In other word, since a rising edge of a signal applied to the input end IN is driven by the first and third drivers 510 and 550, the rising edge of the write strobe signal DCLKP may be almost identical to a rising edge of a signal applied to the input end IN. The falling edge of the write strobe signal DCLKP corresponds to a time point of delaying a falling edge of a signal applied to the input end IN by a time corresponding to the first and second main/complementary control signals CL567, CL567B, CL111213, and CL111213B. That is, the first and second main/complementary control signals CL567, CL567B, CL111213, and CL111213B can control a delay amount corresponding to an inactivation time of the write strobe signal DCLKP.

For the sake of easier description, it is assumed that the first main control signal CL567 becomes logic 'high' and the second main control signal CL111213 becomes logic 'low' if an operation frequency of a semiconductor memory device is low. It is also assumed that the first main control signal CL567 becomes logic 'low' and the second main control signal CL111213 becomes logic 'high' if an operation frequency of a semiconductor memory device is high. Furthermore, it is assumed that the first main control signal CL567 and the second main control signal CL111213 become logic 'low' if the operation frequency of the semiconductor memory device is in between.

At first, an operation when the operation frequency of the semiconductor memory device is in-between will be described.

The third PMOS transistor PME of the first load controller 532 is turned off in response to the second complementary control signal CL111213, and the fourth PMOS transistor PM4 is turned off in response to the first main control signal CL567. That is, a driving path of the second driver 530 includes first and second resistors R1 and R2. The third NMOS transistor NM3 of the second load controller 572 is turned off in response to the second main control signal CL111213. The fourth NMOS transistor NM4 is turned on in response to the first complementary control signal CL567B. That is, a driving path of the fourth driver 570 includes fourth and fifth resistors R4 and R5. Finally, the falling edge of the write strobe signal DCLKP is delayed by a time corresponding to the first and second resistors R1 and R2 and the fourth and fifth resistors R4 and R5 and outputted.

Secondly, operation when the operation frequency of the semiconductor memory device is low will be described.

The third and fourth PMOS transistors PM3 and PM4 of the first load controller 532 are turned off, and the third and fourth NMOS transistors NM3 and NM4 of the second load controller 572 are turned off. That is, the falling edge of the write strobe signal DCLKP is delayed by a time corresponding to the first to third resistors R1, R2, and R3, and the fourth to sixth resistors R4, R5, and R6. The falling edge of the write strobe signal DCLKP is located behind that in the first case.

Thirdly, operation when the operation frequency of the semiconductor memory device is high will be described.

The third and fourth PMOS transistors PM3 and PM4 of the first load controller 532 are turned on and the third and fourth NMOS transistors NM3 and NM4 of the second load controller 572 are turned on. Finally, the falling edge of the write strobe signal DCLKP is delayed by a time corresponding to the first and fourth resistors R1 and R4. That is, the falling edge of the write strobe signal DCLKP is located ahead of the first case.

Figure 6A:
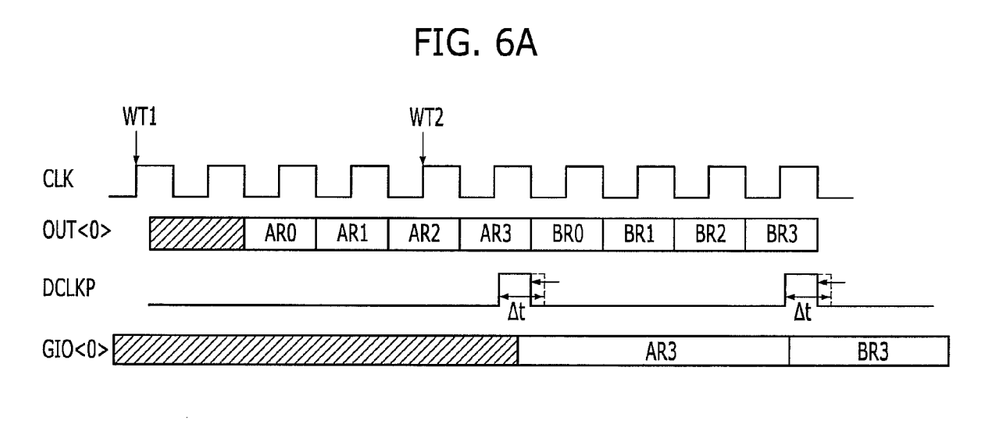
FIGS. 6A and 6B are diagrams describing operation of a semiconductor memory device in accordance with an embodiment of the present invention.
Figure 6B:
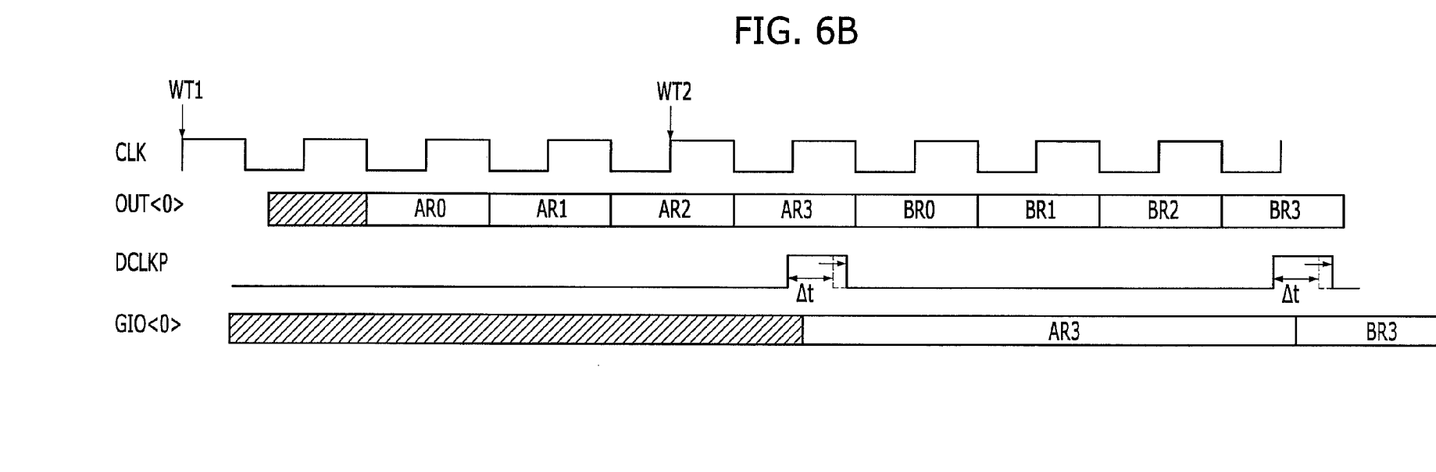

FIGS. 6A and 6B are diagrams for describing operation of a semiconductor memory device in accordance with an embodiment of the present invention. FIGS. 6A and 6B show that a semiconductor memory device receives consecutive write commands. Hereinafter, a write command received at first is referred as a first write command WT1 and a write command received secondly is referred as a second write command WT2 for easier description.

At first, operation when an operation frequency of a semiconductor memory device is comparatively high will be described with reference to FIGS. 4 and 6A.

When the first write command WT1 is applied, the data strobe signal DQS (not shown) is activated and the serial input data AR0, AF0, AR1, AF1, AR2, AF2, AR3, and AF3 (see FIG. 3B) corresponding to the first write command WT1 are sequentially applied. The data aligner 410 aligns the serial input data AR0, AF0, AR1, AF1, AR2, AF2, AR3, and AF3, and the aligned serial input data AR0, AF0, AR1, AF1, AR2, AF2, AR3, and AF3 become the $0^{th}$ to $7^{th}$ parallel output data OUT<0:7>. FIG. 6A exemplarily shows only the $0^{th}$ output data OUT<0> among the $0^{th}$ to $7^{th}$ output data OUT<0:7> and $0^{th}$ global input/output line GIO<0> for the sake of easier description. That is, the $0^{th}$ output data OUT<0> outputs AR0, AR1, AR2, and AR3 corresponding to the first write command WT1.

Then, the strobe signal generator 470 may control a pulse width of the output signal generated from the delay 450 using the first and second main/complementary control signals CL567, CL567B, CL111213, and CL111213B. For example, if a pulse width of the write strobe signal DCLKP generated in the first case of FIG. 5 is assumed as Δt, it is possible to generate a write strobe signal DCLKP having a pulse width smaller than Δt in FIG. 6A. Here, since the pulse width smaller than Δt is included in the last input data AR3 corresponding to the first write command WT1, the input data AR3 corresponding to the first write command WT1 is safely transferred to the $0^{th}$ global input/output line GIO<0>.

If the second write command WT2 is applied, serial input data BR0, BF0, BR1, BF1, BR2, BF2, BR3, and BF3 corresponding to the second write command WT2 are sequentially applied after the last input data AR3 corresponding to the first write command WT1. Similarly, the data aligner 410 aligns the serial input data BR0, BF0, BR1, BF1, BR2, BF2, BR3, and BF3 corresponding to the second write command WT2, and the aligned serial input data BR0, BF0, BR1, BF1, BR2, BF2, BR3, and BF3 become $0^{th}$ to $7^{th}$ output data OUT<0:7>. Then, the write strobe signal DCLKP is activated at the center of the input data BR3 which is the last input data corresponding to the second write command WT2 and may have a pulse width smaller than Δt. Since the pulse width of the write strobe signal DCLKP is included in the last input data BR2 corresponding to the second write command WT2, the $0^{th}$ global input/output line GIO<0> can safely receive the last input data BR3 corresponding to the second write command WT2.

Then, operation when an operation frequency of a semiconductor memory device is comparatively low will be described with reference to FIG. 4 and FIG. 6B.

When the first write command WT1 is applied, the data strobe signal DQS (not shown) is activated and the serial input data AR0, AF0, AR1, AF1, AR2, AF2, AR3, and AF3 (see FIG. 3A) corresponding to the first write command WT1 are sequentially applied. Then, the serial input data AR0, AF0, AR1, AF1, AR2, AF2, AR3, and AF3 are aligned by the data aligner 410 and becomes $0^{th}$ to $7^{th}$ output data OUT<0:7>. FIG. 6B exemplarily shows the $0^{th}$ output data OUT<0> among the $0^{th}$ to $7^{th}$ output data OUT<0:7> and $0^{th}$ input/output line GIO<0>. That is, the $0^{th}$ output data OUT<0> may output AR0, AR1, AR2, and AR3 corresponding to the first write command WT1.

Then, a pulse width of an output signal generated from the delay 450 may be controlled by the strobe signal generator 470 through the first and second main/complementary control signals CL567, CL567B, CL111213, and CL111213B. That is, in FIG. 6B, the write strobe signal DCLKP having a pulse width wider than Δt may be generated. Here, since the pulse width wider than Δt is included in the last input data AR3 corresponding to the first write command WT1, the input data AR3 corresponding to the first write command WT1 can be safely transferred to the $0^{th}$ global input/output line GIO<0>.

If the second write command WT2 is applied, the serial input data BR0, BF0, BR1, BF1, BR2, BF2, BR3, and BF3 corresponding to the second write command WT2 are sequentially applied after the last input data AR3 corresponding to the first write command WT1. Similarly, the serial input data BR0, BF0, BR1, BF1, BR2, BF2, BR3, and BF3 corresponding to the second write command WT2 are aligned by the data aligner 410 and become $0^{th}$ to $7^{th}$ output data OUT<0:7>. Then, the write strobe signal DCLKP is activated at the center of the input data BR3 which is the last input data corresponding to the second write command WT2 and has a pulse width wider than Δt. Since the write strobe signal DCLKP is included in the last input data BR2 corresponding to the second write command WT2, the $0^{th}$ global input/output line GIO<0> can safely receive the last input data BR2 corresponding to the second write command WT2.

As described above, the semiconductor memory device according to the present embodiment defines an activation time of the write strobe signal DCLKP in response to the write command WT and sustains the activation of the write strobe signal DCLKP during a period corresponding to the operation frequency. It means that the write strobe signal DCLKP is activated or inactivated in the aligned data period. Therefore, it is possible to obtain a stable time to apply data to the $0^{th}$ to $7^{th}$ global input/output lines GIO<0:7>. Furthermore, it is possible to enhance reliability by reducing error in the semiconductor memory device. Moreover, it is also possible to guarantee stable circuit operation in various operation frequencies because the semiconductor memory device according to the present embodiment can perform corresponding operation although the operation frequency is changed.

While the present invention has been described with respect to the specific embodiments, it will be apparent to those skilled in the art that various changes and modifications may be made without departing from the spirit and scope of the invention as defined in the following claims.

Moreover, locations and types of logical gates and transistors in the above embodiments may be changed or modified according to a signal polarity.

What is claimed is:

1. A semiconductor memory device, comprising:
   a strobe signal generator configured to receive a write command, generate a control signal for controlling an activation of a write strobe signal in response to an operation frequency of the semiconductor memory device, and to generate the write strobe signal that defines an activation period variably based on the operation frequency in response to the write command and the control signal; and
   a data transfer unit configured to transfer data from an external device to an internal data line in response to the write strobe signal.

2. The semiconductor memory device of claim 1, further comprising: a pulse delay unit configured to delay a write pulse signal until a predetermined time point where the write pulse signal is generated in response to the write command.

3. The semiconductor memory device of claim 2, wherein the pulse delay unit includes:
   a write pulse generator configured to generate the write pulse signal having a predetermined pulse width in response to the write command; and
   a delay unit configured to delay the write pulse signal by a predetermined time interval.

4. The semiconductor memory device of claim 1, further comprising: a data aligner configured to align the data from an external device in parallel and inputting the aligned data to the data transfer unit.

5. The semiconductor memory device of claim 4, wherein the data aligner includes a plurality of latches that latch the data from an external device in response to a data strobe signal.

6. The semiconductor memory device of claim 2, wherein the write pulse signal has CAS latency information, additive latency information, and burst length information.

7. The semiconductor memory device of claim 1, wherein the strobe signal generator includes:
   a control signal generator configured to generate the control signal in response to the operation frequency of the semiconductor memory device; and
   a strobe signal output unit configured to output the write strobe signal in response to the write command and the control signal.

8. The semiconductor memory device of claim 7, wherein the strobe signal is activated in response to the write command and inactivated in response to the control signal.

9. The semiconductor memory device of claim 7, wherein the control signal controls a delay amount corresponding to an inactivation time of the write strobe signal.

10. The semiconductor memory device of claim 7, wherein the strobe signal output unit includes:
    a first driver configured to drive a node to a ground voltage in response to a rising edge which is an activation edge of a write pulse signal; and
    a second driver configured to drive the node to a voltage in response to a falling edge which is an inactivation edge of the write pulse signal and to control a load value of a driving path in response to the control signal.

11. The semiconductor memory device of claim 1, wherein the operation frequency corresponds to CAS latency.

12. A method of driving a semiconductor memory device, comprising:
    activating a write strobe signal in response to a write command;
    generating a control signal for controlling an activation period of the write strobe signal in response to an operation frequency;
    outputting the write strobe signal in response to the write command and the control signal; and
    transferring data from an external device to an internal data line in response to the write strobe signal.

13. The method of claim 12, further comprising:
    aligning the data from an external device in parallel;
    generating a write pulse signal having a predetermined pulse width in response to the write command; and
    delaying the write pulse signal by a predetermined time interval.

14. The method of claim 13, wherein the aligning of the data includes sequentially latching the data from an external device in response to a data strobe signal.

15. The method of claim 13, wherein the write pulse signal includes CAS latency information, additive latency information, and burst length information.

16. The method of claim 12, wherein the write strobe signal is activated in response to the write command and inactivated in response to the control signal.

17. The method of claim 12 wherein the control signal controls a delay amount corresponding to an inactivation time of the write strobe signal.

18. The method of claim 12, wherein the outputting of the write strobe signal includes:
    driving a node to a ground voltage in response to an activation edge of a write pulse signal;
    controlling a load value of a driving path in response to the control signal; and
    driving the node to a voltage based on the load value of the driving path and a supply voltage in response to an inactivation edge of the write pulse signal.

19. The method of claim 12, wherein the operation frequency corresponds to CAS latency.

* * * * *